US010483427B2

(12) United States Patent
Choi et al.

(10) Patent No.: US 10,483,427 B2
(45) Date of Patent: Nov. 19, 2019

(54) METHOD OF MANUFACTURING SOLAR CELL

(71) Applicant: LG Electronics Inc., Seoul (KR)

(72) Inventors: Jaewoo Choi, Seoul (KR); Chungyi Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 44 days.

(21) Appl. No.: 15/831,904

(22) Filed: Dec. 5, 2017

(65) Prior Publication Data
US 2018/0158977 A1    Jun. 7, 2018

(30) Foreign Application Priority Data

Dec. 5, 2016  (KR) .................. 10-2016-0164540

(51) Int. Cl.
*H01L 31/18*      (2006.01)
*H01L 31/0236*    (2006.01)
*H01L 31/0745*    (2012.01)
*H01L 31/0747*    (2012.01)

(52) U.S. Cl.
CPC ........ *H01L 31/18* (2013.01); *H01L 31/02363* (2013.01); *H01L 31/0745* (2013.01); *H01L 31/0747* (2013.01); *H01L 31/182* (2013.01); *H01L 31/1804* (2013.01); *Y02E 10/546* (2013.01); *Y02E 10/547* (2013.01); *Y02P 70/521* (2015.11)

(58) Field of Classification Search
CPC ............... H01L 31/18; H01L 31/02363; H01L 31/1892; H01L 31/1896; Y02P 70/521
See application file for complete search history.

(56) References Cited

U.S. PATENT DOCUMENTS

| | | | | |
|---|---|---|---|---|
| 5,510,146 | A * | 4/1996 | Miyasaka | ............... C23C 16/44 118/715 |
| 2015/0020877 | A1* | 1/2015 | Moslehi | .......... H01L 31/022441 136/256 |
| 2015/0040971 | A1* | 2/2015 | Stan | .................... H01L 31/1892 136/255 |
| 2015/0122178 | A1* | 5/2015 | Vadadi | ............. C23C 16/45504 118/723 R |

FOREIGN PATENT DOCUMENTS

| EP | 2642525 A2 | 9/2013 |
|---|---|---|
| EP | 2980858 A2 | 2/2016 |
| WO | WO2009131587 A2 | 10/2009 |

OTHER PUBLICATIONS

Extended European Search Report in European Application No. 17205128.6, dated Apr. 11, 2018, 7 pages.

* cited by examiner

*Primary Examiner* — Jay C Chang
*Assistant Examiner* — Mikka Liu
(74) *Attorney, Agent, or Firm* — Fish & Richardson P.C.

(57) ABSTRACT

A method of manufacturing a solar cell is disclosed. The method includes an overlap operation of overlapping front surfaces of two semiconductor substrates each other, a semiconductor layer depositing operation of simultaneously depositing a semiconductor layer on back surfaces of the two semiconductor substrates overlapping each other, a separating operation of separating the two semiconductor substrates overlapping each other, and a front surface texturing operation of texturing the front surfaces of the two semiconductor substrates after an etch stop layer forming operation.

20 Claims, 20 Drawing Sheets

METHOD OF MANUFACTURING SOLAR CELL

CROSS-REFERENCE TO RELATED APPLICATION

This application claims priority to and the benefit of Korean Patent Application No. 10-2016-0164540 filed in the Korean Intellectual Property Office on Dec. 5, 2016, the entire contents of which are incorporated herein by reference.

TECHNICAL FIELD

Implementations of the invention relate to a method of manufacturing a solar cell.

BACKGROUND

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductivity types, for example, a p-type and an n-type and thus form a p-n junction, and electrodes respectively connected to the semiconductor parts of the different conductivity types.

When light is incident on the solar cell, a plurality of electron-hole pairs are produced in the semiconductor parts and are separated into electrons and holes by the incident light. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration may be connected to one another through intercell connectors to form a module.

In a related art solar cell in which amorphous silicon or polycrystalline silicon was deposited on one surface of a semiconductor substrate, it took a relatively long time to deposit silicon on one surface of the semiconductor substrate, which was a hindrance to an increase in a production amount of the solar cell.

For example, a technology in which polycrystalline silicon was deposited on a surface of a semiconductor substrate to form a conductive region was disclosed in U.S. Pat. Publication Nos. 5,786,027 and 8,242,354.

However, such a related art deposited silicon on an entire surface of each semiconductor substrate in a process for depositing silicon on the semiconductor substrate. In the related art, because the process for depositing silicon on the semiconductor substrate was separately performed on each of the semiconductor substrates, there was a limit to a reduction in a process time of the solar cell.

SUMMARY

Implementations of the invention provide a method of manufacturing a solar cell capable of increasing a production amount of the solar cell by reducing time required in a deposition operation of depositing silicon on a surface of a semiconductor substrate.

In one aspect, there is provided a method of manufacturing a solar cell including an overlap operation of overlapping front surfaces of two semiconductor substrates each other; a semiconductor layer depositing operation of simultaneously depositing a semiconductor layer on back surfaces of the two semiconductor substrates overlapping each other; a separating operation of separating the two semiconductor substrates overlapping each other; and a front surface texturing operation of texturing the front surfaces of the two semiconductor substrates after an etch stop layer forming operation.

In the overlap operation, the two semiconductor substrates, which overlap each other at a section defined by a wall so that the front surfaces of the two semiconductor substrates contact each other, may be entered into a deposition equipment for depositing the protective layer and the semiconductor layer.

The semiconductor layer depositing operation may be performed using a low pressure chemical vapor deposition (LPCVD) equipment.

The semiconductor layer deposited in the semiconductor layer depositing operation may be formed of at least one of intrinsic amorphous silicon, intrinsic polycrystalline silicon, amorphous silicon having impurities, or polycrystalline silicon having impurities.

A thickness of the semiconductor layer deposited in the semiconductor layer depositing operation may be 250 nm to 450 nm.

In the semiconductor layer depositing operation, the semiconductor layer may be deposited at edges of the overlapping front surfaces of the two semiconductor substrates together with the back surfaces of the two semiconductor substrates.

In the separating operation, the two semiconductor substrates overlapping each other at the section may be individually separated.

The front surface texturing operation may include texturing the front surfaces of the two semiconductor substrates using a reactive ion etching (RIE) method or a wet etching method; and removing the semiconductor layer formed at edges of the front surfaces of the two semiconductor substrates.

An etching depth of the front surface of the semiconductor substrate in the front surface texturing operation is 100 nm to 5 µm.

For example, the semiconductor layer deposited in the semiconductor layer depositing operation may be at least one of an intrinsic amorphous semiconductor layer or an intrinsic polycrystalline semiconductor layer.

The method of manufacturing the solar cell may further include a first thermal processing operation performed between the separating operation and the front surface texturing operation, the first thermal processing operation including thermally processing a portion of the semiconductor layer formed on the back surface of the semiconductor substrate to form the first conductive region having impurities; a second thermal processing operation performed after the front surface texturing operation, the second thermal processing operation including thermally processing the entire front surface of the semiconductor substrate and a remaining portion excluding the portion from the semiconductor layer formed on the back surface of the semiconductor substrate to form the second conductive region having impurities of a conductivity type opposite a conductivity type of the impurities contained in the first conductive region; and an electrode forming operation of forming a first electrode on the first conductive region formed at the back surface of the semiconductor substrate and forming a second electrode on the second conductive region formed at the back surface of the semiconductor substrate.

The method of manufacturing the solar cell may further include a passivation layer forming operation of forming a passivation layer on the front surface and the back surface of the semiconductor substrate after the second thermal processing operation.

In the first thermal processing operation, the portion of the semiconductor layer may be thermally processed using a laser and may be formed as the first conductive region.

The semiconductor layer deposited in the semiconductor layer depositing operation may be formed of at least one of amorphous semiconductor layer having impurities or polycrystalline semiconductor layer having impurities. In the semiconductor layer depositing operation, the second conductive region may be formed at the back surface of the semiconductor substrate.

In this instance, the method of manufacturing the solar cell may further include a thermal processing operation performed after the front surface texturing operation, the thermal processing operation including diffusing impurities of a conductivity type opposite a conductivity type of impurities contained in the semiconductor layer into the front surface of the semiconductor substrate to form the first conductive region; and an electrode forming operation of forming a first electrode on the first conductive region formed at the front surface of the semiconductor substrate and forming a second electrode on the second conductive region formed at the back surface of the semiconductor substrate.

The method of manufacturing the solar cell according to implementations of the invention can simultaneously deposit the semiconductor layer on the back surfaces opposite the front surfaces of the two semiconductor substrates in a state where the front surfaces of the two semiconductor substrates overlap each other, thereby increasing productivity of solar cells to about two times a related art.

Further, the method of manufacturing the solar cell according to implementations of the invention can deposit the semiconductor layer on the back surfaces of the two semiconductor substrates and then texture the front surface of each semiconductor substrate, thereby properly secure efficiency of solar cells.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention. In the drawings.

DETAILED DESCRIPTION

Figure 1:
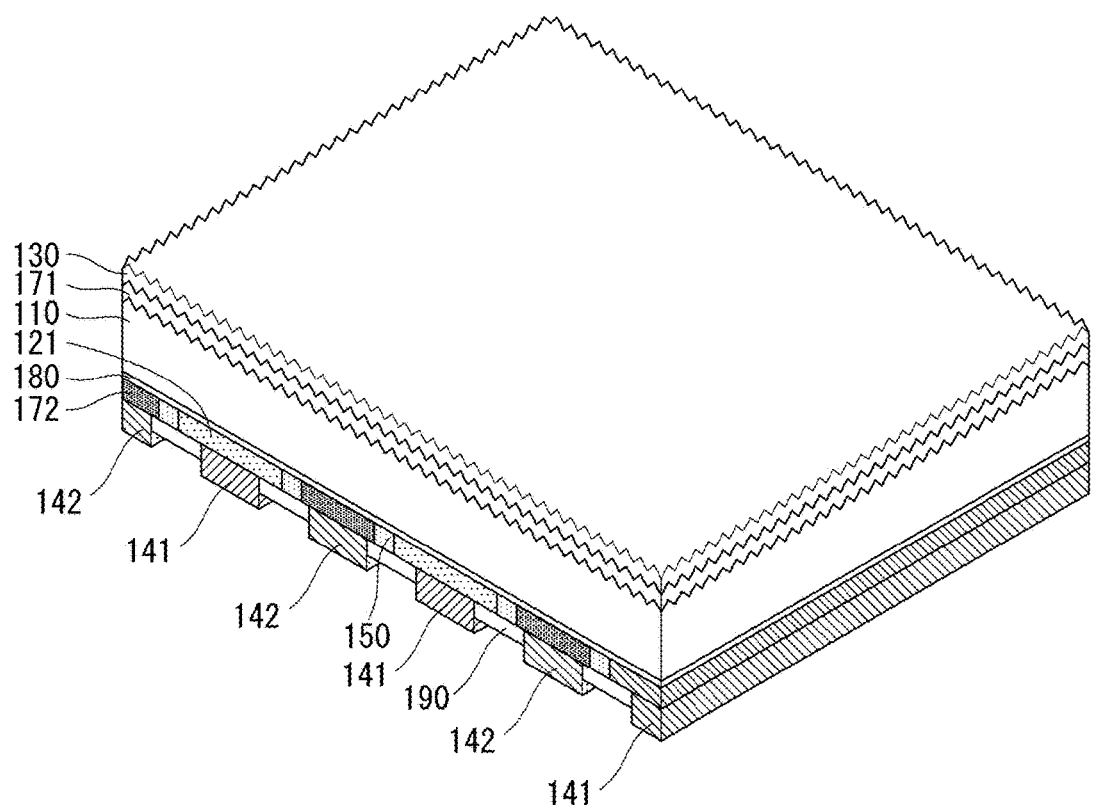
FIGS. 1 to 3 illustrate an example of a solar cell manufactured through a method of manufacturing a solar cell according to an implementation of the invention.

Reference will now be made in detail to implementations of the invention, examples of which are illustrated in the accompanying drawings. This invention may, however, be implemented in many different forms and should not be construed as limited to the implementations set forth herein. Wherever possible, the same reference numbers will be used throughout the drawings to refer to the same or like parts. It will be noted that a detailed description of known arts will be omitted if it is determined that the detailed description of the known arts can obscure the implementations of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

In the following description, a cell string indicates a structure or a shape, in which a plurality of solar cells are connected in series to one another.

In the following description, the fact that a thickness or a width of a component is equal to a thickness or a width of another component indicates that they have the same value within a margin of error of 10% including a process error.

Figure 2:
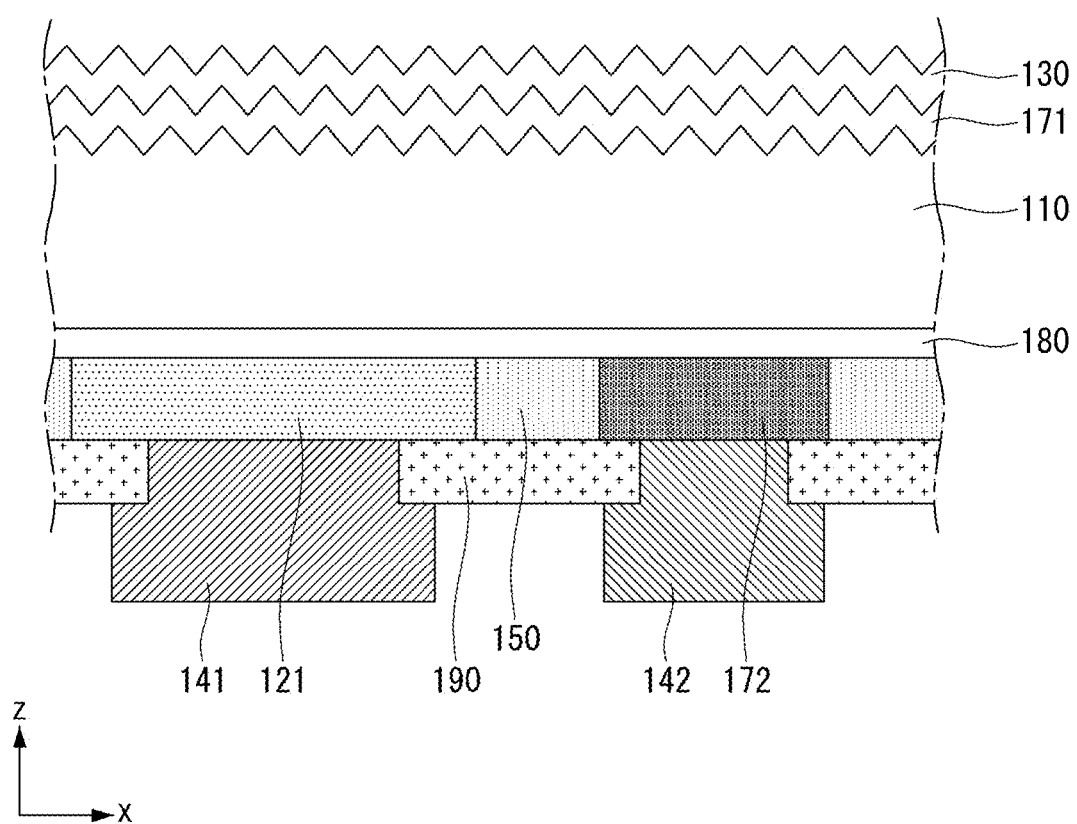
Figure 3:
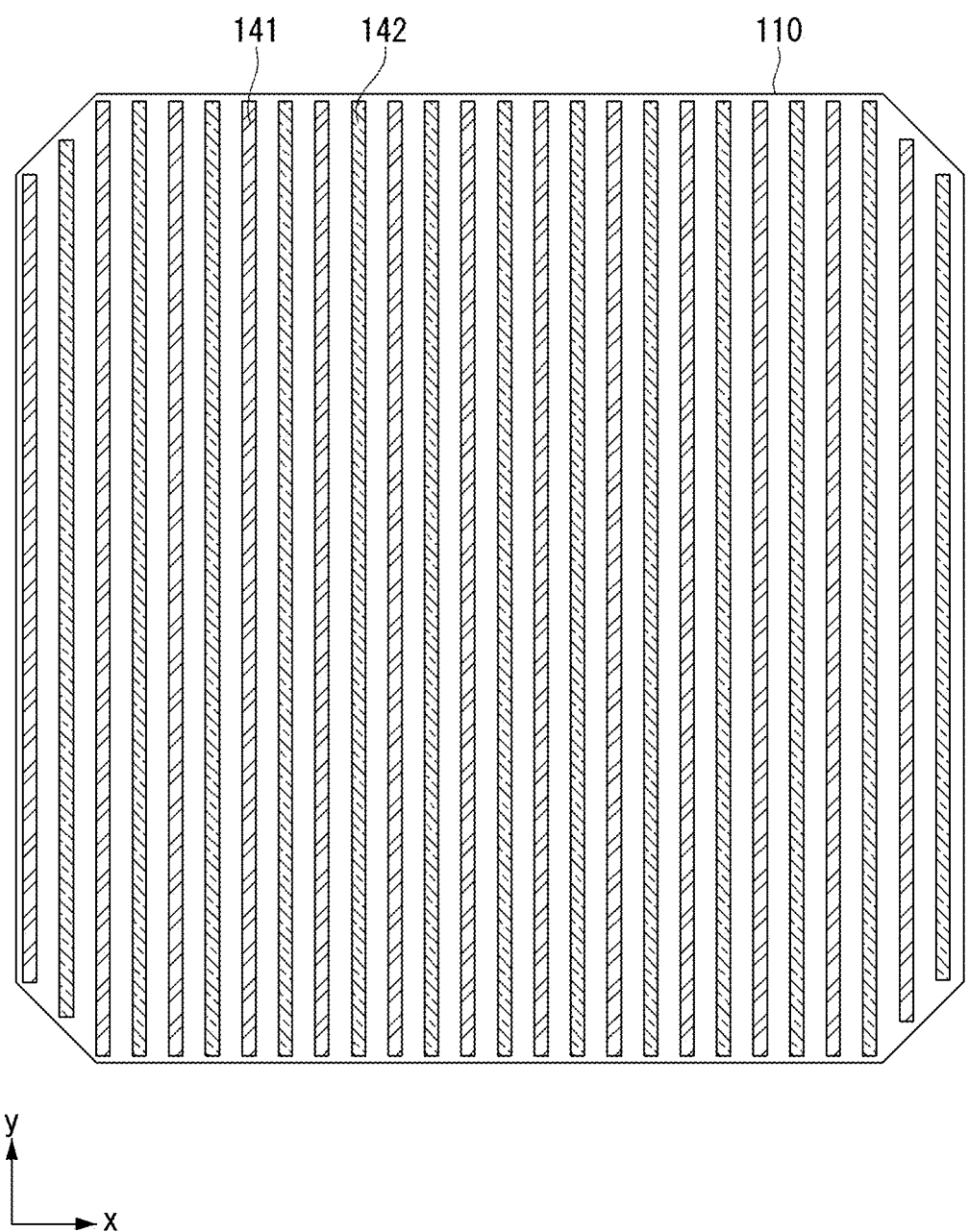

FIGS. 1 to 3 illustrate an example of a solar cell manufactured through a method of manufacturing a solar cell according to an implementation of the invention. More specifically, FIG. 1 is a partial perspective view illustrating an example of a solar cell according to an implementation of the invention. FIG. 2 is a cross-sectional view of the solar cell shown in FIG. 1 in a first direction. FIG. 3 illustrates a pattern of first and second electrodes formed on a back surface of a semiconductor substrate.

As shown in FIGS. 1 and 2, an example of a solar cell according to an implementation of the invention may include an anti-reflection layer 130, a semiconductor substrate 110, a protective layer 180, a plurality of first conductive regions 121, a plurality of second conductive regions 171 and 172, a plurality of intrinsic semiconductor regions 150, a passivation layer 190, a plurality of first electrodes 141, and a plurality of second electrodes 142.

In implementations disclosed herein, the anti-reflection layer 130 and the passivation layer 190 may be omitted, if desired or necessary. However, when the solar cell includes them, efficiency of the solar cell can be further improved. Thus, the implementation of the invention is described using the solar cell including the anti-reflection layer 130 and the passivation layer 190 as an example.

The semiconductor substrate 110 may be formed of at least one of single crystal silicon and polycrystalline silicon having impurities of a first conductivity type or a second conductivity type. For example, the semiconductor substrate 110 may be formed of a single crystal silicon wafer.

In implementations disclosed herein, the first conductivity type or the second conductivity type of the semiconductor substrate 110 may be one of an n-type and a p-type.

When the semiconductor substrate 110 is of the p-type, the semiconductor substrate 110 may be doped with impurities of a group III element such as boron (B), gallium (Ga), and indium (In). Alternatively, when the semiconductor substrate 110 is of the n-type, the semiconductor substrate 110 may be doped with impurities of a group V element such as phosphorus (P), arsenic (As), and antimony (Sb).

In the following description, the implementation of the invention is described using an example where impurities contained in the semiconductor substrate 110 are impurities of the second conductivity type and are n-type impurities. However, the implementation of the invention is not limited thereto.

A front surface of the semiconductor substrate 110 may be an uneven surface having a plurality of uneven portions or having uneven characteristics. Thus, the second conductive region 171 on the front surface of the semiconductor substrate 110 may have an uneven surface. Hence, an amount of light reflected from the front surface of the semiconductor substrate 110 can decrease, and an amount of light incident on the inside of the semiconductor substrate 110 can increase.

The anti-reflection layer 130 may be positioned on the front surface of the semiconductor substrate 110, in order to minimize a reflection of light incident on the front surface of the semiconductor substrate 110 from the outside. The anti-reflection layer 130 may be formed of at least one of aluminum oxide (AlOx), silicon nitride (SiNx), silicon oxide (SiOx), and silicon oxynitride (SiOxNy).

The protective layer 180 may be disposed to directly contact an entire back surface of the semiconductor substrate 110 and may include a dielectric material. Thus, as shown in FIGS. 1 and 2, the protective layer 180 may pass carriers produced in the semiconductor substrate 110.

In other words, the protective layer 180 may pass carriers produced in the semiconductor substrate 110 and perform a passivation function with respect to the back surface of the semiconductor substrate 110.

The protective layer 180 may be formed of SiON, SiNx, SiCx or SiOx and have a thickness of 0.5 nm to 5 nm.

As shown in FIGS. 1 and 2, the first conductive regions 121 may be disposed at the back surface of the semiconductor substrate 110. For example, the first conductive regions 121 may be disposed to directly contact a portion of a back surface of the protective layer 180.

The first conductive regions 121 may be extended in a second direction y at the back surface of the semiconductor substrate 110. The first conductive regions 121 may be formed of polycrystalline silicon material of the first conductivity type opposite the second conductivity type.

The first conductive regions 121 may be doped with impurities of the first conductivity type. When impurities contained in the semiconductor substrate 110 is impurities of the second conductivity type, the first conductive regions 121 may form a p-n junction together with the semiconductor substrate 110 with the protective layer 180 interposed therebetween.

Because each first conductive region 121 forms the p-n junction together with the semiconductor substrate 110, the first conductive region 121 may be of the p-type. When the first conductive region 121 is of the p-type, the first conductive region 121 may be doped with impurities of a group III element such as B, Ga, and In.

Each of the second conductive regions 171 and 172 may be a region that is more heavily doped than the semiconductor substrate 110 with impurities of the second conductivity type. The second conductive regions 171 and 172 may be disposed at the front surface and the back surface of the semiconductor substrate 110.

The second conductive regions 172 at the back surface of the semiconductor substrate 110 may be extended in the second direction y parallel to the first conductive regions 121 disposed at the back surface of the semiconductor substrate 110. For example, each second conductive region 172 may be formed to directly contact a portion (spaced apart from each first conductive region 121) of the back surface of the protective layer 180. The second conductive regions 172 may be formed of polycrystalline silicon material.

Further, the second conductive region 171 at the front surface of the semiconductor substrate 110 may be disposed at the entire front surface of the semiconductor substrate 110. Because the second conductive region 171 is formed by doping the front surface of the semiconductor substrate 110 with impurities, the second conductive region 171 may be formed of the same material (for example, a silicon material) as the semiconductor substrate 110.

For example, when the semiconductor substrate 110 is formed of a single crystal silicon material, the second conductive region 171 at the front surface of the semiconductor substrate 110 may be formed of a single crystal silicon material. Alternatively, when the semiconductor substrate 110 is formed of a polycrystalline silicon material, the second conductive region 171 at the front surface of the semiconductor substrate 110 may be formed of a polycrystalline silicon material.

The second conductive regions 171 and 172 may be formed of a silicon material that is more heavily doped than the semiconductor substrate 110 with impurities of the second conductivity type. Thus, for example, when the semiconductor substrate 110 is doped with impurities of the second conductivity type, i.e., n-type impurities, the second conductive regions 171 and 172 may be n+-type regions.

A potential barrier is formed by a difference in an impurity concentration between the semiconductor substrate 110 and the second conductive regions 172. Hence, the potential barrier can prevent or reduce holes from moving to the second conductive regions 172 used as a moving path of electrons and can make it easier for carriers (for example, electrons) to move to the second conductive regions 172.

Thus, the implementation of the invention can reduce an amount of carriers lost by a recombination and/or a disappearance of electrons and holes at and around the second conductive regions 171 and 172 or at and around the first and second electrodes 141 and 142 and can accelerates a movement of electrons, thereby increasing an amount of electrons moving to the second conductive regions 172.

FIGS. 1 and 2 illustrate that the semiconductor substrate 110 is doped with impurities of the second conductivity type; the first conductive regions 121 serve as an emitter region; the second conductive region 171 at the front surface of the semiconductor substrate 110 serves as a front surface field region; and the second conductive regions 172 at the back surface of the semiconductor substrate 110 serve as a back surface field region, by way of example.

However, when the semiconductor substrate 110 is doped with impurities of the first conductivity type unlike FIGS. 1 and 2, the first conductive regions 121 may serve as a back surface field region, and the second conductive regions 171 and 172 may serve as an emitter region.

Further, FIGS. 1 and 2 illustrate that the first conductive regions 121 and the second conductive regions 172 are formed on the back surface of the protective layer 180 using polycrystalline silicon material, by way of example.

As shown in FIGS. 1 and 2, the intrinsic semiconductor region 150 may be formed on the back surface of the protective layer 180 exposed between the first conductive region 121 and the second conductive region 172. The intrinsic semiconductor region 150 may be formed as an intrinsic polycrystalline silicon layer, that is not doped with impurities of the first conductivity type or impurities of the second conductivity type, unlike the first conductive region 121 and the second conductive region 172.

Further, as shown in FIGS. 1 and 2, the intrinsic semiconductor region 150 may be configured such that both sides of the intrinsic semiconductor region 150 directly contact the side of the first conductive region 121 and the side of the second conductive region 172, respectively.

The passivation layer 190 can remove a defect resulting from a dangling bond formed in a back surface of a polycrystalline silicon layer formed at the first conductive regions 121, the second conductive regions 172, and the intrinsic semiconductor layers 150, and thus can prevent carriers produced in the semiconductor substrate 110 from being recombined and disappeared by the dangling bond.

As shown in FIG. 3, the plurality of first electrodes 141 may be connected to the first conductive regions 121 and may extend in the second direction y. The first electrodes 141 may collect carriers (for example, holes) moving to the first conductive regions 121.

The plurality of second electrodes 142 may be connected to the second conductive regions 172 and may extend in the second direction y in parallel with the first electrodes 141. The second electrodes 142 may collect carriers (for example, electrons) moving to the second conductive regions 172.

As shown in FIG. 3, the first and second electrodes 141 and 142 may extend in the second direction y and may be spaced apart from each other in the first direction x. Further, the first and second electrodes 141 and 142 may be alternately disposed in the first direction x.

In the solar cell according to the implementation of the invention having the above-described structure, holes collected by the first electrodes 141 and electrons collected by the second electrodes 142 may be used as electric power of an external device through an external circuit device.

The solar cell according to the implementation of the invention is not limited to a back contact solar cell shown in FIGS. 1 to 3. The components of the solar cell may be variously changed, except that the first and second electrodes 141 and 142 included in the solar cell are formed on the back surface of the semiconductor substrate 110.

For example, the solar cell according to the implementation of the invention may be applied to a metal wrap through (MWT) solar cell, that is configured such that a portion of the first electrode 141 and the first conductive region 121 are positioned on the front surface of the semiconductor substrate 110, and the portion of the first electrode 141 is connected to a remaining portion of the first electrode 141 formed on the back surface of the semiconductor substrate 110 through a hole of the semiconductor substrate 110.

A method of manufacturing a solar cell according to an implementation of the invention is described as follows.

FIGS. 4 to 17 illustrate a method of manufacturing a solar cell according to an implementation of the invention.

Figure 4:
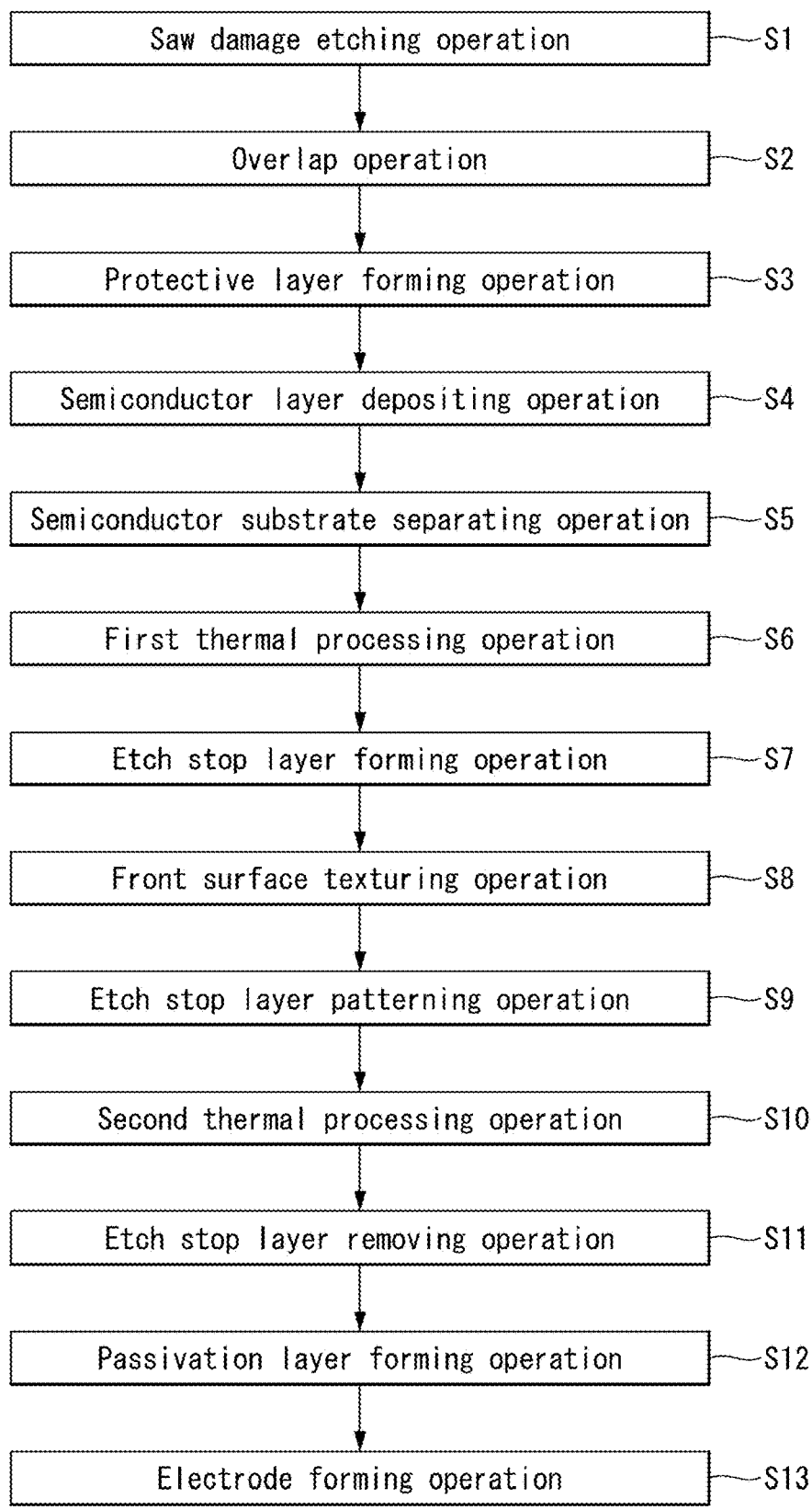
FIGS. 4 to 17 illustrate a method of manufacturing a solar cell according to an implementation of the invention.

More specifically, FIG. 4 is a flow chart illustrating a method of manufacturing a solar cell according to an implementation of the invention. FIGS. 5 to 17 illustrate each of stages illustrated FIG. 4.

As shown in FIG. 4, a method of manufacturing a solar cell according to an implementation of the invention may at least include an overlap operation S2, a semiconductor layer depositing operation S4, a semiconductor substrate separating operation S5, and a front surface texturing operation S8. In addition, the method of manufacturing the solar cell according to the implementation of the invention may further include a saw damage etching operation S1, a protective layer forming operation S3, a first thermal processing operation S6, an etch stop layer forming operation S7, an etch stop layer patterning operation S9, a second thermal processing operation S10, an etch stop layer removing operation S11, a passivation layer forming operation S12, and an electrode forming operation S13.

In implementations disclosed herein, the saw damage etching operation S1, the protective layer forming operation S3, the first thermal processing operation S6, the etch stop layer forming operation S7, the etch stop layer patterning operation S9, the second thermal processing operation S10, the etch stop layer removing operation S11, and the passivation layer forming operation S12 may be modified or omitted depending on an electrode structure or a thermal processing method of the solar cell.

Hereinafter, a method of manufacturing a solar cell including the saw damage etching operation S1, the protective layer forming operation S3, the first thermal processing operation S6, the etch stop layer forming operation S7, the etch stop layer patterning operation S9, the second thermal processing operation S10, the etch stop layer removing operation S11, the passivation layer forming operation S12, and the electrode forming operation S13 is described as an example of a method of manufacturing the back contact solar cell shown in FIGS. 1 to 3.

In the saw damage etching operation S1, a surface of each semiconductor substrate 110 may be etched using a chemical method in order to remove a defect generated in a surface of a silicon wafer formed by cutting an ingot.

In this instance, the entire surface of the semiconductor substrate 110 may be etched by a predetermined depth using potassium hydroxide (KOH) solution as an etching solution, and then may be cleaned using deionized water (DIW), etc.

After the saw damage etching operation S1 is completed, the overlap operation S2 may be performed.

Figure 5:
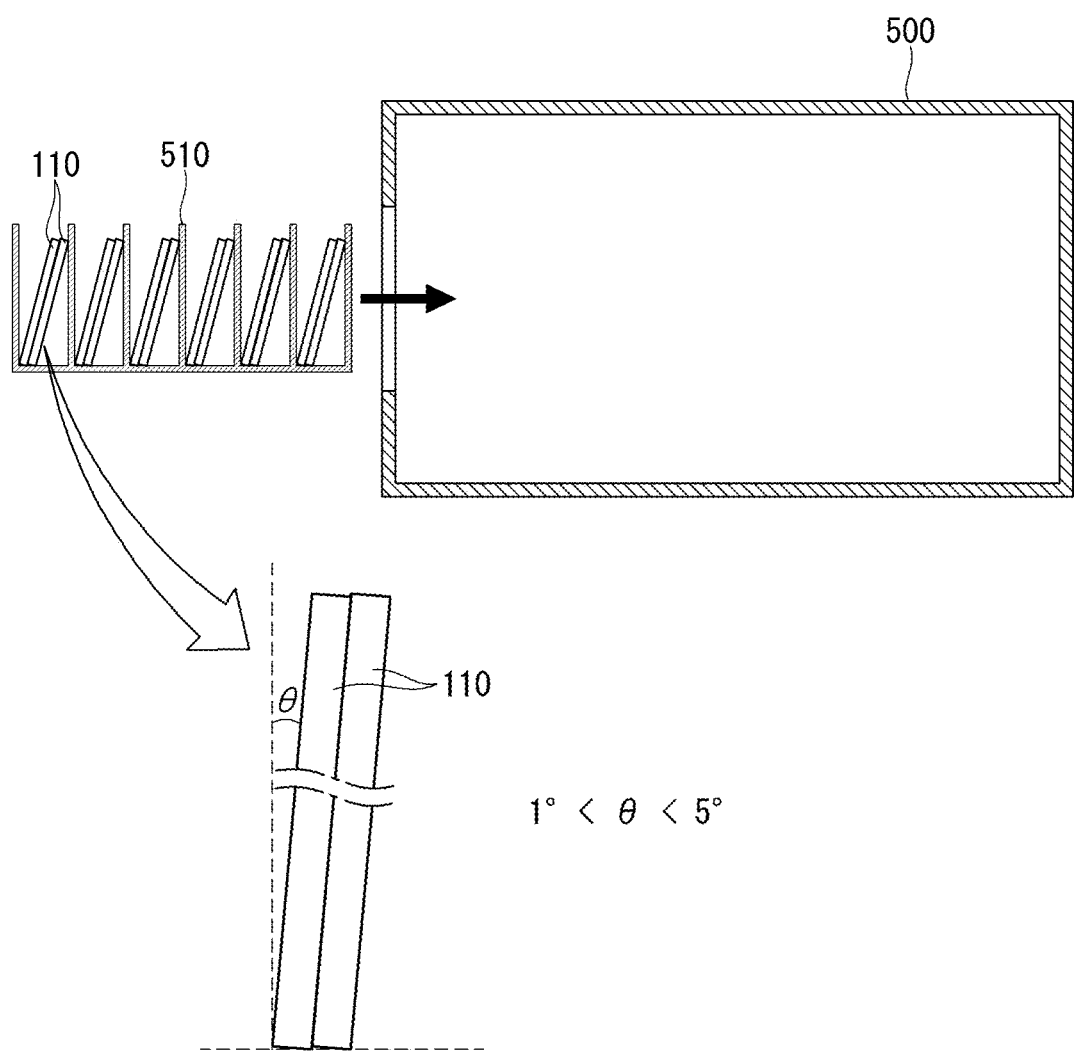

In the overlap operation S2, front surfaces of two semiconductor substrates 110 may overlap each other. More specifically, in the overlap operation S2, as shown in FIG. 5, the two semiconductor substrates 110 may be disposed at a section that is defined by a wall 510 so that the front surfaces of the two semiconductor substrates 110 contact each other.

In the overlap operation S2, the two semiconductor substrates 110, which are disposed at the section that is defined by the wall 510 so that the front surfaces of the two semiconductor substrates 110 contact each other, may be entered into a deposition equipment 500 for depositing a protective layer 180 and a semiconductor layer 150.

An angle θ between a surface of the two overlapped semiconductor substrates 110 and the wall 510 may be greater than 1° and less than 5°.

The protective layer forming operation S3 and the semiconductor layer depositing operation S4 may be performed on the two semiconductor substrates 110 which contact and overlap each other at the section that is defined by the wall 510 as described above.

For example, the protective layer forming operation S3 may be performed through a thermal oxidation process for loading the two overlapping semiconductor substrates 110 to a furnace and performing a thermal processing of about 500° C. to 600° C. on the two overlapping semiconductor substrates 110 to react with oxygen inside the furnace, thereby forming the protective layer 180 on the surfaces of the two overlapping semiconductor substrates 110. Alternatively, the protective layer forming operation S3 may be performed through a wet process for immersing the two overlapping semiconductor substrates 110 in an aqueous solution having an oxygen component to form the protective layer 180 on the surfaces of the two overlapping semiconductor substrates 110.

The semiconductor layer depositing operation S4 may be performed using a low pressure chemical vapor deposition (LPCVD) equipment 500.

Figure 6:
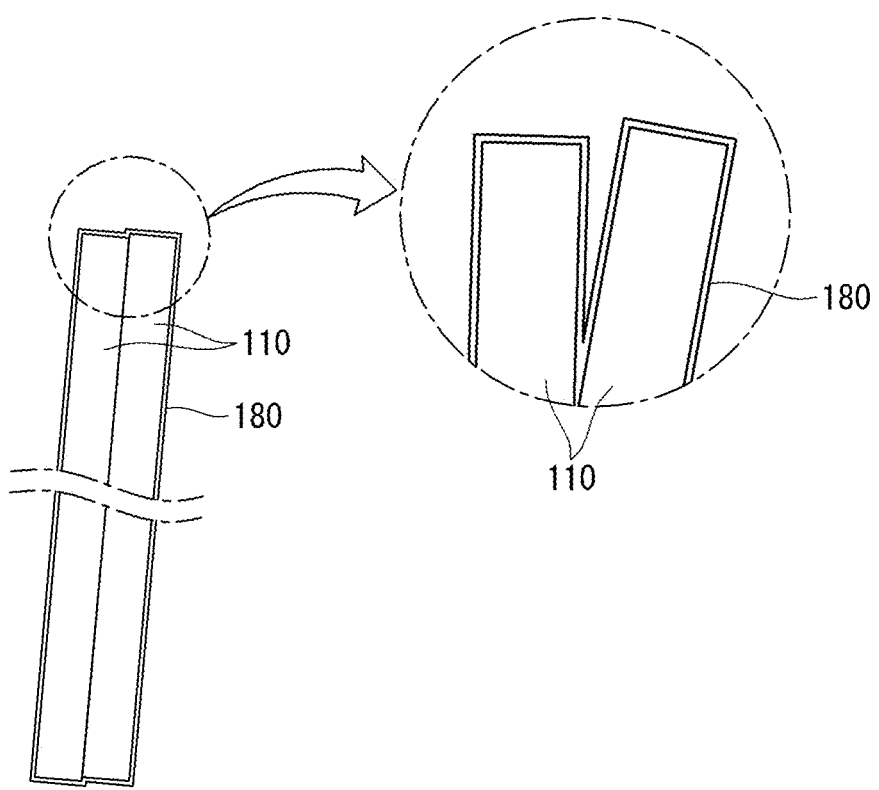

As shown in FIG. 6, in the protective layer forming operation S3, the protective layer 180 may be entirely deposited on back surfaces opposite the front surfaces of the two overlapping semiconductor substrates 110.

A material of the protective layer 180 deposited on the semiconductor substrates 110 may be one of SiON, SiNx, SiCx and SiOx.

In this instance, as shown in FIG. 6, the protective layer 180 may be simultaneously deposited on the entire back surfaces of the two overlapping semiconductor substrates 110. In addition, the protective layer 180 may be deposited on the side as well as the back surface of each semiconductor substrate 110.

The protective layer 180 deposited in the protective layer forming operation S3 may be deposited at edges of the overlapping front surfaces of the two semiconductor substrates 110 together with the back surfaces of the two semiconductor substrates 110.

Namely, even when the two semiconductor substrates 110 overlap each other at the section that is defined by the wall 510, a fine gap may be generated between the two semiconductor substrates 110 during the protective layer forming operation S3 and the semiconductor layer depositing operation S4. Hence, the protective layer 180 may be formed at an edge of the front surface of each semiconductor substrate 110.

When the thermal processing of about 500° C. to 600° C. is performed at the same time as forming the protective layer 180 on the semiconductor substrate 110, the protective layer 180 may be mainly formed on the entire back surface of the semiconductor substrate 110.

In this instance, each of the two overlapping semiconductor substrates 110 may be subjected to a thermal expansion stress. As shown in FIG. 6, an edge of the semiconductor substrate 110 may be swollen in a direction of the back surface of the semiconductor substrate 110 on which the protective layer 180 is mainly formed. Hence, a fine gap may be generated between the edges of the two semiconductor substrates 110 overlapping each other.

The protective layer 180 may be deposited on the surfaces of the two semiconductor substrates 110 overlapping each other to a thickness of 0.5 nm to 5 nm.

The implementation of the invention described the method of manufacturing the solar cell including the protective layer forming operation S3, by way of example. However, the protective layer forming operation S3 may be omitted. In this instance, the protective layer 180 may be omitted in the solar cell shown in FIGS. 1 and 2, and the first conductive region 121, the second conductive region 172, and the intrinsic semiconductor region 150 may be formed to directly contact the back surface of the semiconductor substrate 110.

Figure 7:
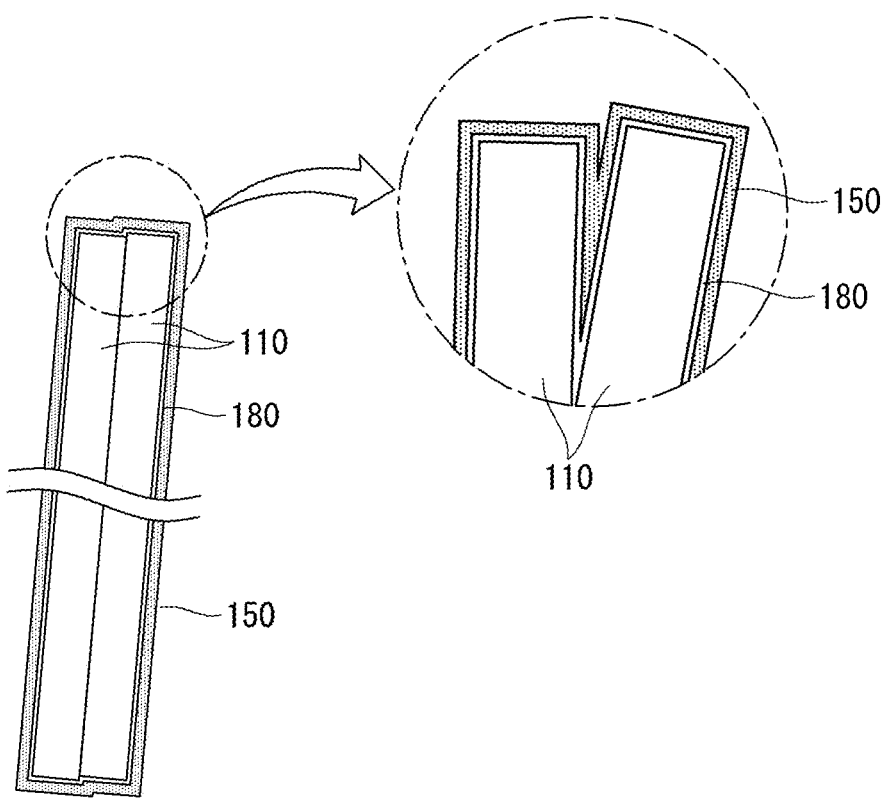

Next, as shown in FIG. 7, in the semiconductor layer depositing operation S4, the semiconductor layer 150 may be entirely deposited on the protective layer 180 on the back surfaces of the two semiconductor substrates 110 overlapping each other.

Thus, in the semiconductor layer depositing operation S4, the semiconductor layer 150 may be simultaneously deposited on the back surfaces of the two semiconductor substrates 110. Further, the semiconductor layer 150 may be deposited on an edge of the front surface and the side of each semiconductor substrate 110 as well as the back surface of each semiconductor substrate 110.

The semiconductor layer 150 deposited in the semiconductor layer depositing operation S4 may be formed of at least one of intrinsic amorphous silicon, intrinsic polycrystalline silicon, amorphous silicon having impurities, or polycrystalline silicon having impurities.

For example, when the back contact solar cell is manufactured as shown in FIGS. 1 to 3, the semiconductor layer 150 deposited in the semiconductor layer depositing operation S4 may be formed of at least one of intrinsic amorphous silicon and intrinsic polycrystalline silicon.

Further, for example, when the semiconductor layer 150 deposited in the semiconductor layer depositing operation S4 may be formed of amorphous silicon, the amorphous silicon layer 150 may be recrystallized in the subsequent first thermal processing operation S6 or the subsequent second thermal processing operation S10.

A thickness of the semiconductor layer 150 deposited in the semiconductor layer depositing operation S4 may be 250 nm to 450 nm.

After the semiconductor layer depositing operation S4, the semiconductor substrate separating operation S5 of separating the two semiconductor substrates 110 overlapping each other may be performed. Namely, the separating operation S5 of individually separating the two semiconductor substrates 110, which are disposed to overlap each other at a section defined by the wall 510, may be simply performed without using a separate etchant or a separate equipment.

The separating operation S5 can easily separate individually the two semiconductor substrates 110 using a vacuum suction device (not shown).

More specifically, in the separating operation S5, the vacuum suction device may suck one of the two overlapping semiconductor substrates 110 and may lift one semiconductor substrate 110 in a direction (i.e., a thickness direction of the substrate 110) perpendicular to an overlap direction of the two semiconductor substrates 110, thereby detaching the two overlapping semiconductor substrates 110 from each other.

After the two overlapping semiconductor substrates 110 is individually separated in the semiconductor substrate separating operation S5, the first thermal processing operation S6 may be performed.

In the first thermal processing operation S6, thermal processing may be performed on a portion S1 of the semiconductor layer 150 positioned on the back surface of the semiconductor substrate 110 to form the first conductive region 121 having impurities.

Figure 8A:
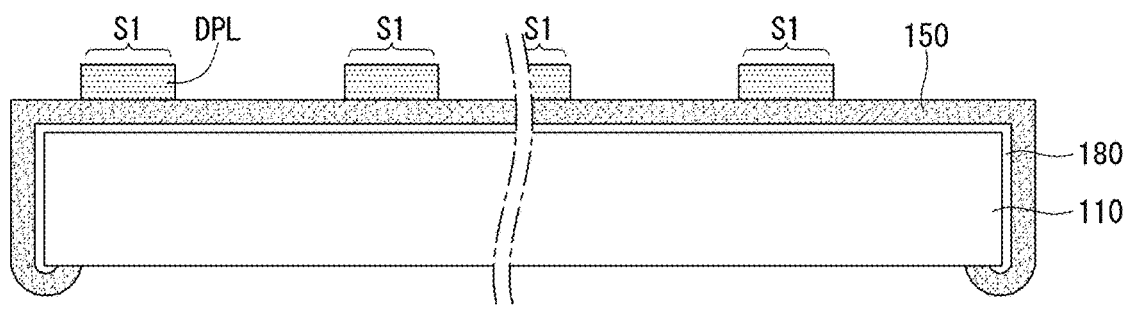
Figure 8B:
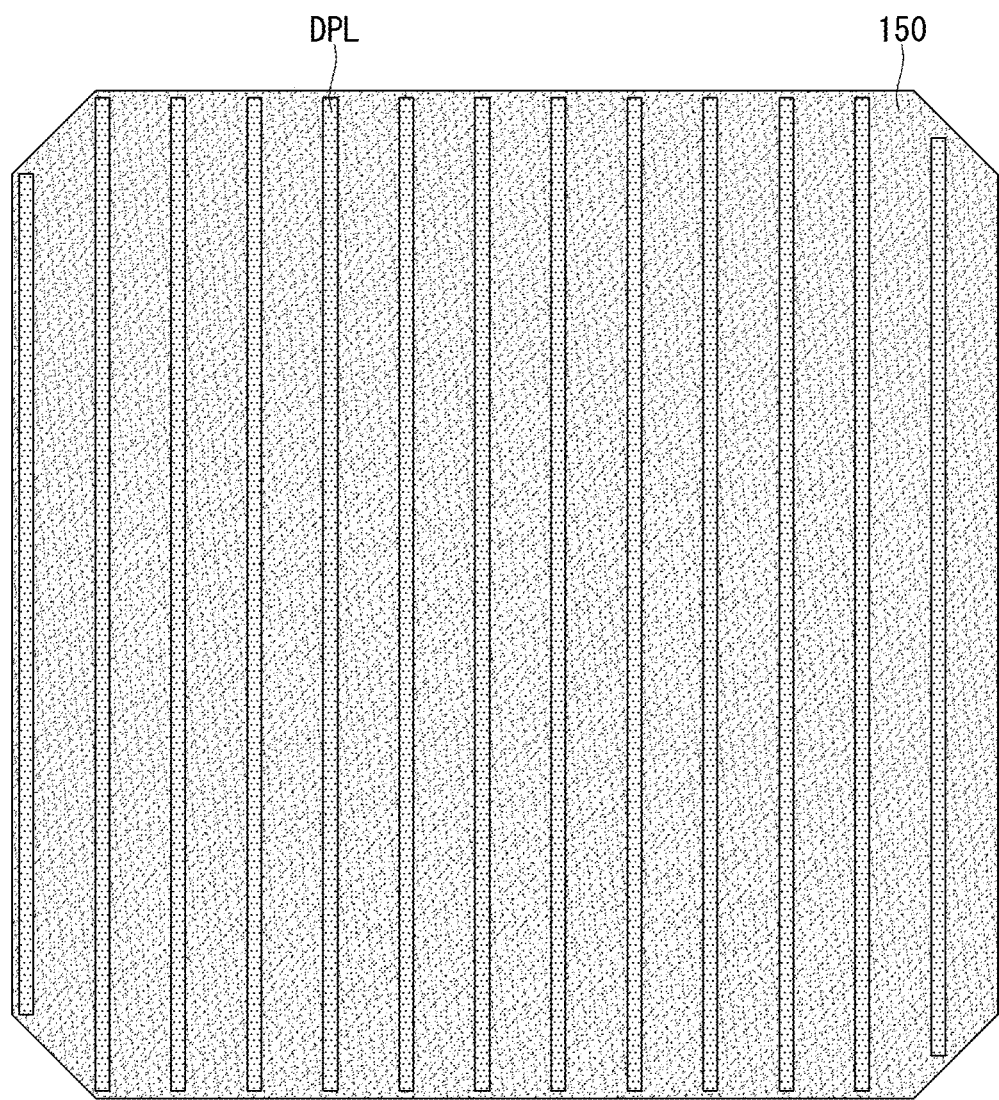

More specifically, as shown in FIGS. 8A and 8B, a dopant layer DPL having impurities of a first conductivity type may be patterned on the portion S1 of the semiconductor layer 150 to form the first conductive region 121 in the first thermal processing operation S6.

A lithography method, a printing method, etc. may be used to pattern the dopant layer DPL on the portion S1 of the semiconductor layer 150.

The dopant layer DPL may be borosilicate glass (BSG) having p-type impurities or phosphosilicate glass (PSG) having n-type impurities.

Figure 9:
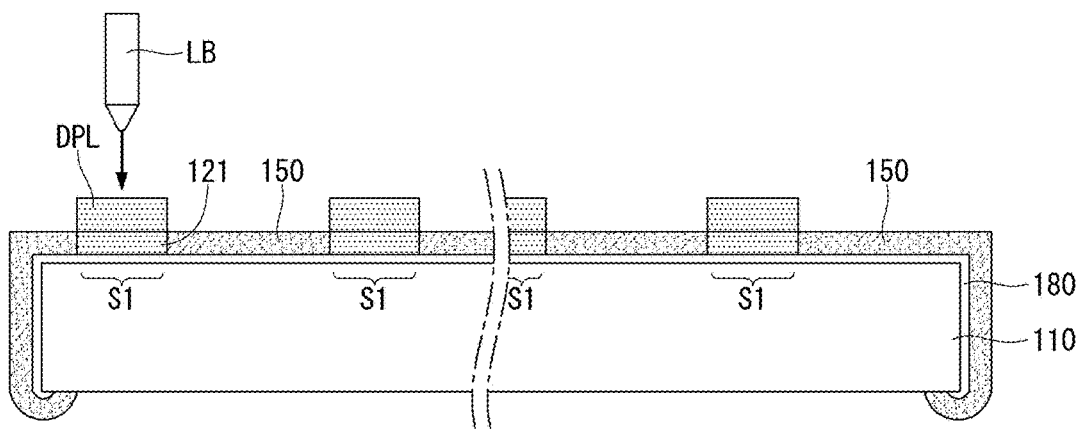

As shown in FIG. 8B, each dopant layer DPL may be patterned to be extended on the semiconductor layer 150 in one direction. As shown in FIG. 9, the thermal processing may be selectively performed on the portion S1 of the semiconductor layer 150 using a laser LB in a state where the dopant layer DPL is formed on the portion S1 of the semiconductor layer 150, thereby forming the portion S1 of the semiconductor layer 150 as the first conductive region 121.

For example, the first conductive region 121 formed in the portion S1 of the semiconductor layer 150 may serve as the emitter region.

Figure 10:
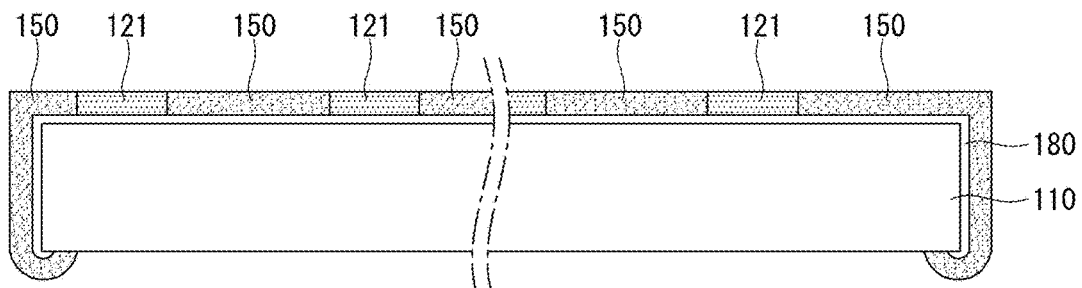

After the first conductive region 121 is formed in the portion S1 of the semiconductor layer 150, the dopant layer DPL may be removed as shown in FIG. 10.

However, a method for forming the first conductive region 121 is not limited to the above-described method and may use various methods.

For example, the dopant layer DPL having impurities may be not partially but entirely formed on the semiconductor layer 150, and then the thermal processing may be selectively performed on the portion S1 of the semiconductor layer 150 using a selective irradiation device such as the laser LB. Hence, the portion S1 of the semiconductor layer 150 may be formed as the first conductive region 121, and then the dopant layer DPL having impurities may be removed.

Figure 11:
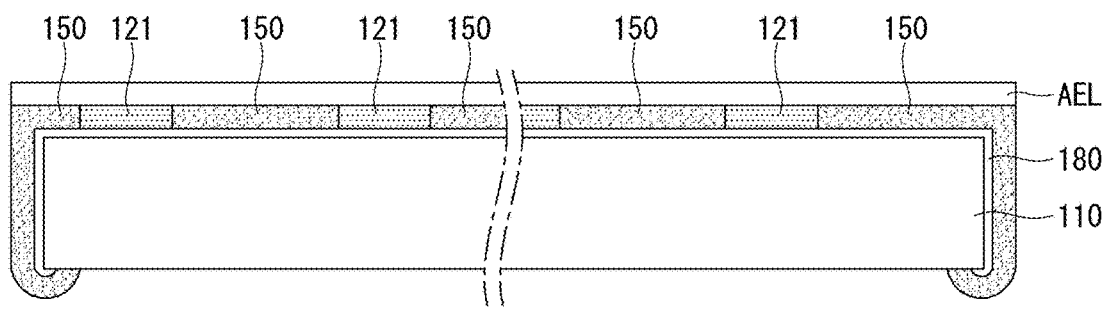

Next, as shown in FIG. 11, in the etch stop layer forming operation S7, an etch stop layer AEL may be formed on the first conductive region 121 and the semiconductor layer 150 formed at the back surface of the semiconductor substrate 110.

The implementation of the invention describes that the etch stop layer AEL is formed, by way of example. However, the etch stop layer AEL is not necessarily required. For example, the etch stop layer forming operation S7 may be omitted depending on an etching method of the front surface texturing operation S8 or an etching equipment used in the front surface texturing operation S8.

After the etch stop layer forming operation S7, the front surface texturing operation S8 of texturing the front surface of the semiconductor substrate 110 may be performed.

The front surface texturing operation S8 may be performed through a wet etching or a dry etching.

When the wet etching is used, for example, an alkali etching using KOH, NaOH, OH-based chemicals or the like or an acid-based etching using $CHCOO_3$, $HNO_3$, HF or the like may be used.

When the dry etching is used, for example, a plasma etching using $NF_3$, $SF_6$, F-based gas or the like or a reactive ion etching (ME) may be used. If the dry etching is used, the etch stop layer forming operation S7 may be omitted.

Figure 12:
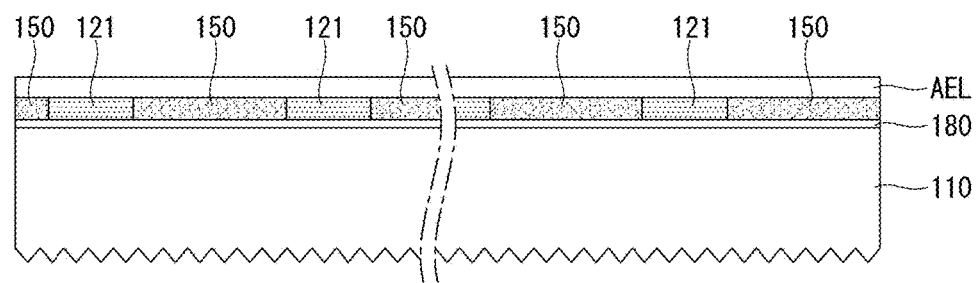

As shown in FIG. 12, in the front surface texturing operation S8, uneven portions may be formed on the front surface of the semiconductor substrate 110.

In the front surface texturing operation S8, an etching depth of the front surface of the semiconductor substrate 110 may be 100 nm to 5 μm. More specifically, in the front surface texturing operation S8, the etching depth of the front surface of the semiconductor substrate 110 may be 2 μm to 5 μm that is about eight times to twelve times the thickness of the semiconductor layer 150 deposited in the semiconductor layer depositing operation S4.

Accordingly, as shown in FIG. 12, in the front surface texturing operation S8, the semiconductor layer 150 and the protective layer 180 formed at the side and an edge of the front surface of the semiconductor substrate 110 may be removed together.

Figure 13:
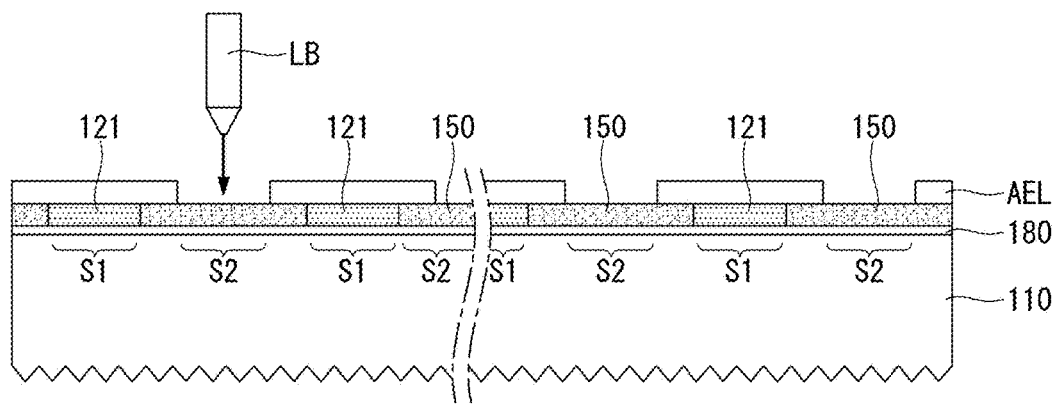

Next, as shown in FIG. 13, the etch stop layer patterning operation S9 of removing a portion S2 of the etch stop layer AEL may be performed using a laser.

As shown in FIG. 13, the portion S2 of the etch stop layer AEL indicates the etch stop layer AEL positioned on the remaining portion S2 excluding the portion S1 (or the formation area S1 of the first conductive region 121) from the semiconductor layer 150.

Figure 14:
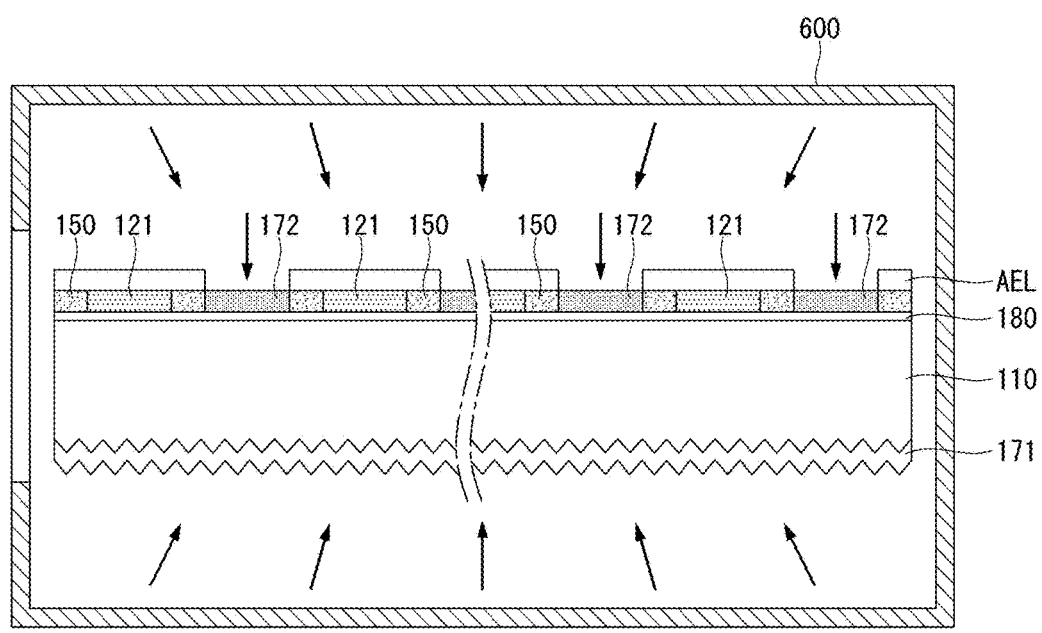

After the etch stop layer patterning operation S9, the second thermal processing operation S10 may be performed. As shown in FIG. 14, in the second thermal processing operation S10, the semiconductor substrate 110 may be driven into a furnace equipment 600 and may be thermally processed as a whole.

When the second thermal processing operation S10 is performed, $BBr_3$ gas or $POCL_3$ gas as an impurity gas together with a gas such as $N_2$, $O_2$, $H_2O$ and $H_2$ may be injected into the furnace equipment 600. Hence, the thermal processing may be performed on the semiconductor substrate 110 at 800° C. to 1,200° C.

For example, when the first conductive region formed in the first thermal processing operation S6 contains boron (B), the $POCL_3$ gas may be injected as the impurity gas in the second thermal processing operation S10. On the contrary, when the first conductive region formed in the first thermal processing operation S6 contains phosphorus (P), the $BBr_3$ gas may be injected as the impurity gas in the second thermal processing operation S10.

In the second thermal processing operation S10, the second conductive region 171 having impurities of a conductivity type opposite a conductivity type of impurities contained in the first conductive region 121 may be formed at the entire front surface of the semiconductor substrate 110.

At the same time as the formation of the second conductive region 171, the second conductive region 172 may be formed at the remaining portion S2 (i.e., the remaining portion S2 of the semiconductor layer 150 exposed by removing the etch stop layer AEL in the etch stop layer patterning operation S9) excluding the portion S1 of the semiconductor layer 150 formed on the back surface of the semiconductor substrate 110.

Hence, for example, the second conductive region 171 formed at the entire front surface of the semiconductor substrate 110 may serve as a front surface field region, and the second conductive region 172 formed at the remaining portion of the semiconductor layer 150 on the back surface of the semiconductor substrate 110 may serve as a back surface field region.

Figure 15:
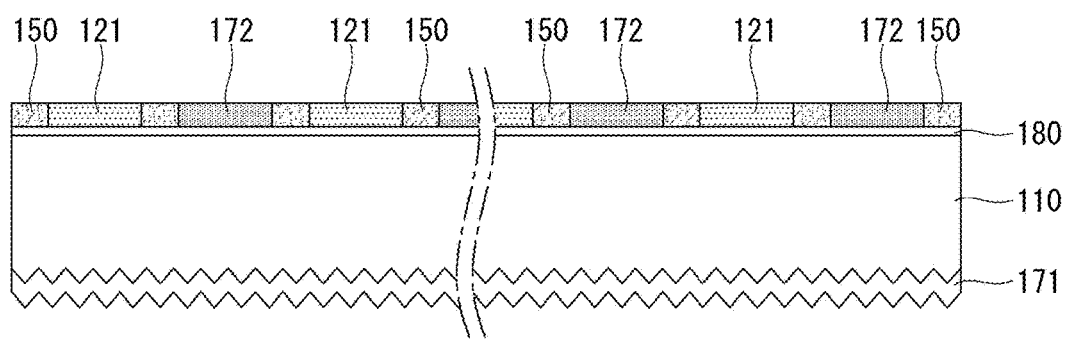
Figure 16:
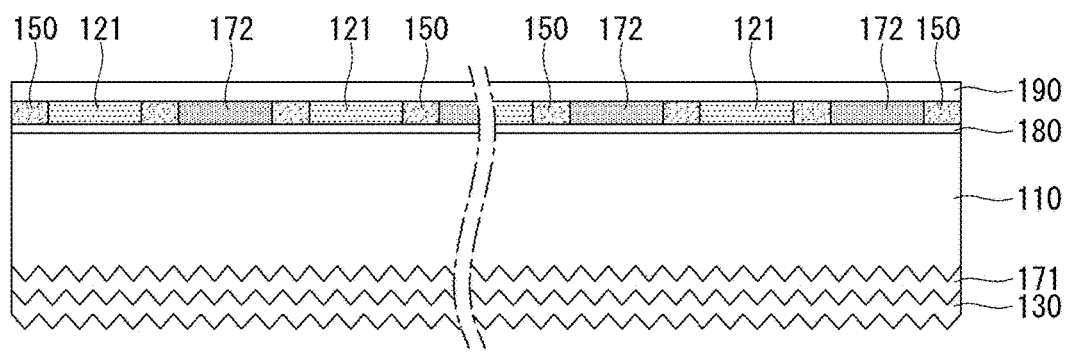
Figure 17:
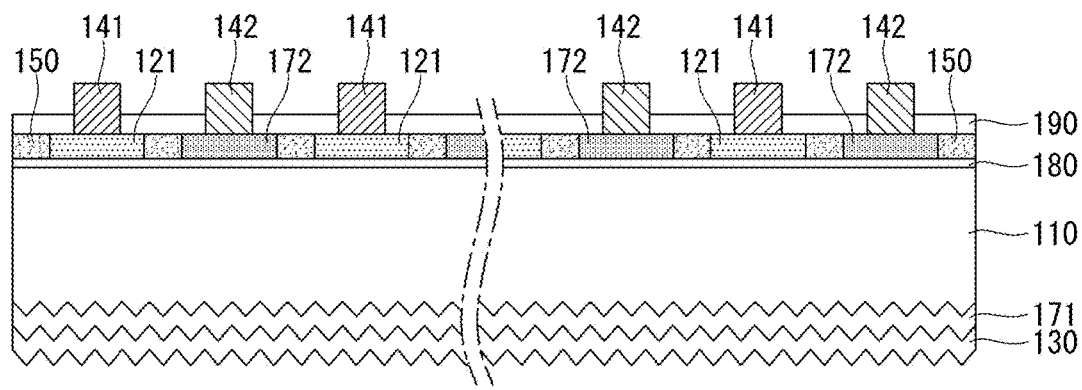

Next, as shown in FIG. 15, the etch stop layer removing operation S11 of completely removing the etch stop layer AEL, which has been formed on the back surface of the semiconductor substrate 110, may be performed.

The etch stop layer removing operation S11 may be performed using, for example, a KOH solution.

Next, the passivation layer forming operation S12 of entirely forming a passivation layer 190 on the front surface and the back surface of the semiconductor substrate 110 may be performed.

More specifically, in the passivation layer forming operation S12, a back passivation layer 190 may be entirely formed on the back surface of the semiconductor substrate 110, and a front passivation layer 130 may be entirely formed on the front surface of the semiconductor substrate 110.

The front passivation layer 130 may serve as the anti-reflection layer 130 illustrated in FIGS. 1 to 3.

Next, the electrode forming operation S13 of forming a first electrode 141 on the first conductive region 121 formed at the back surface of the semiconductor substrate 110 and forming a second electrode 142 on the second conductive region 172 formed at the back surface of the semiconductor substrate 110 may be performed.

Hence, the solar cell illustrated in FIGS. 1 to 3 can be manufactured.

An example of the above-described method of manufacturing the solar cell can greatly increase the productivity of the solar cells by depositing the protective layer 180 and the semiconductor layer 150 on the two semiconductor substrates 110 overlapping each other when forming the solar cell in which the protective layer 180 and the semiconductor layer 150 are deposited on the back surface of the semiconductor substrate 110.

Further, the implementation of the invention can satisfactorily maintain the efficiency of the solar cell by depositing the semiconductor layer 150 on the back surfaces of the two semiconductor substrates 110 and then texturing the front surface of each semiconductor substrate 110 to completely remove the semiconductor layer 150 formed at a portion of the edge of the front surface of the semiconductor substrate 110.

So far, the implementation of the invention described a method of manufacturing a back contact solar cell using the method of manufacturing the solar cell according to the implementation of the invention. However, the method of manufacturing the solar cell according to the implementation of the invention may be applied to a solace cell in which the electrodes are disposed on each of the front surface and the back surface of the semiconductor substrate 110.

Hereinafter, an example in which the method of manufacturing the solar cell according to the implementation of the invention is applied to a solace cell in which electrodes are disposed on both a front surface and a back surface of the solar cell will be described.

Figure 18:
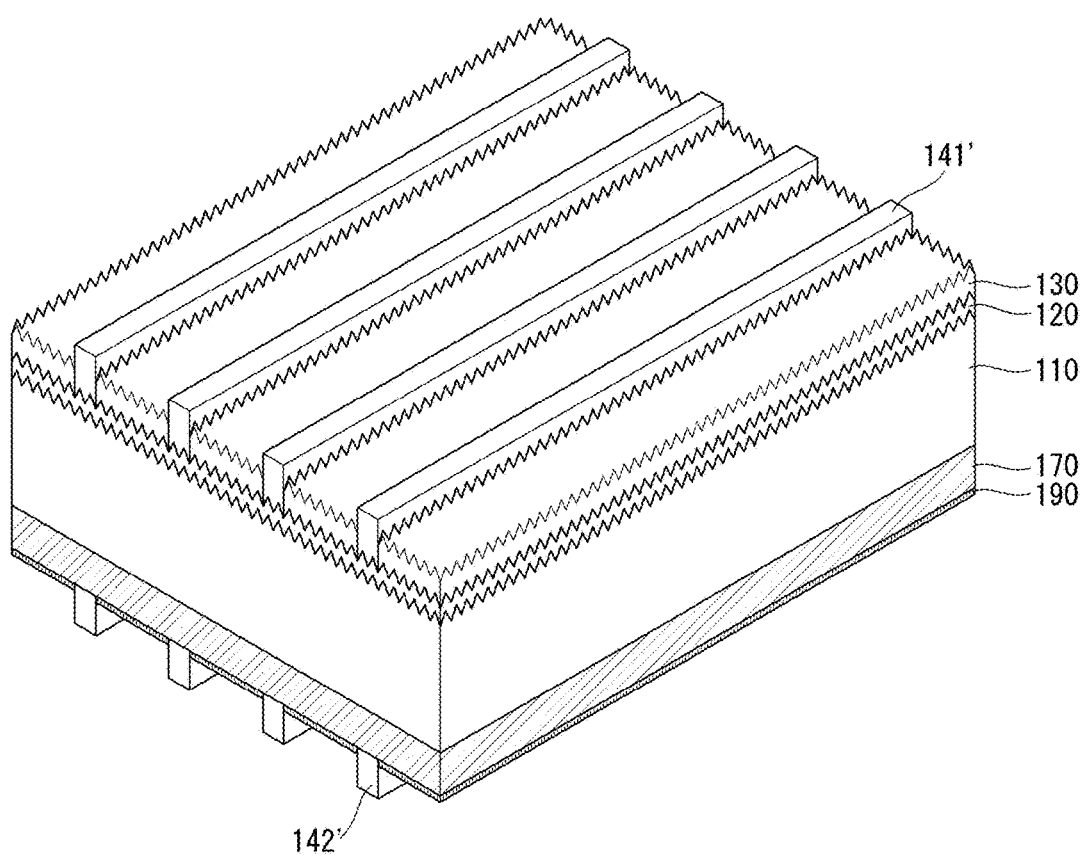
FIGS. 18 and 19 illustrate an example of a solar cell manufactured through a method of manufacturing a solar cell according to another implementation of the invention.
Figure 19:
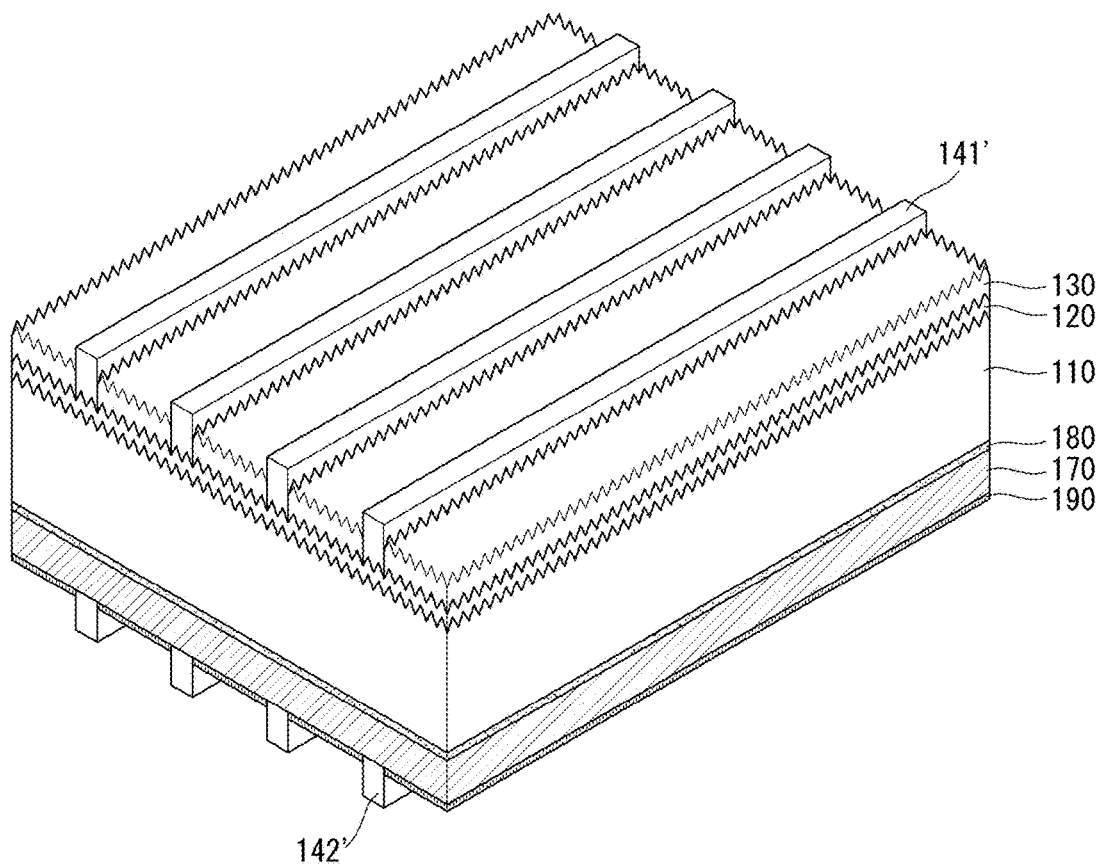

FIGS. 18 and 19 illustrate an example and a modified example of a solar cell manufactured through a method of manufacturing a solar cell according to another implementation of the invention. More specifically, FIG. 18 illustrates an example of a solar cell according to another implementation of the invention, and FIG. 19 illustrates a modified example of the solar cell shown in FIG. 18.

As shown in FIG. 18, a solar cell according to another implementation of the invention may include a semiconductor substrate 110, a first conductive region 120, an anti-reflection layer 130, a second conductive region 170, a passivation layer 190, a plurality of first electrodes 141', and a plurality of second electrodes 142'.

Further, as shown in FIG. 19, a solar cell according to a modified example may include a semiconductor substrate 110, a first conductive region 120, an anti-reflection layer 130, a protective layer 180, a second conductive region 170, a passivation layer 190, a plurality of first electrodes 141', and a plurality of second electrodes 142'. Namely, the solar cell according to the modified example may further include the protective layer 180.

FIGS. 18 and 19 illustrate that the solar cell according to the implementation of the invention includes the anti-reflection layer 130, by way of example. However, the anti-reflection layer 130 may be omitted in the implementation of the invention, if desired or necessary. However, when the solar cell includes the anti-reflection layer 130, efficiency of the solar cell can be further improved. Thus, the implementation of the invention will be described using the solar cell including the anti-reflection layer 130 as an example.

In the following description, a description of structures and components identical or similar to those illustrated in FIGS. 1 to 17 is omitted in FIGS. 18 and 19, and a difference between them will be mainly described.

As shown in FIGS. 18 and 19, in the solar cell according to an example and a modified example of another implementation of the invention, the first conductive region 120, the front passivation layer (for example, the anti-reflection layer 130), and the first electrodes 141' may be positioned at a front surface of the semiconductor substrate 110. As shown in FIG. 18, the second conductive region 170, the back passivation layer 190, and the second electrodes 142' may be positioned at a back surface of the semiconductor substrate 110. Alternatively, as shown in FIG. 19, the protective layer 180, the second conductive region 170, the back passivation layer 190, and the second electrodes 142' may be positioned at a back surface of the semiconductor substrate 110.

In the implementation of the invention, the second conductive region 170 may be formed by entirely depositing a semiconductor layer on the protective layer 180.

In the implementation of the invention, the first conductive region 120 may be entirely formed at the front surface of the semiconductor substrate 110 and may serve as an emitter region. The second conductive region 170 may be entirely formed at the back surface of the semiconductor substrate 110 and may serve as a back surface field region.

Further, the first electrodes 141' may be connected to the first conductive region 120 positioned at the front surface of the semiconductor substrate 110, and the second electrodes 142' may be connected to the second conductive region 170 positioned at the back surface of the semiconductor substrate 110.

A method of manufacturing the solar cell according to the example and the modified example of another implementation of the invention is described as follows.

FIGS. 20 to 26 illustrate a method of manufacturing a solar cell according to another implementation of the invention.

The method of manufacturing the solar cell according to the example of another implementation of the invention may be substantially the same as the method of manufacturing the solar cell according to the modified example of another implementation of the invention, except that a protective layer forming operation S3 is omitted.

Thus, the method of manufacturing the solar cell according to the modified example of another implementation of the invention will be basically described below for convenience of explanation.

Figure 20:
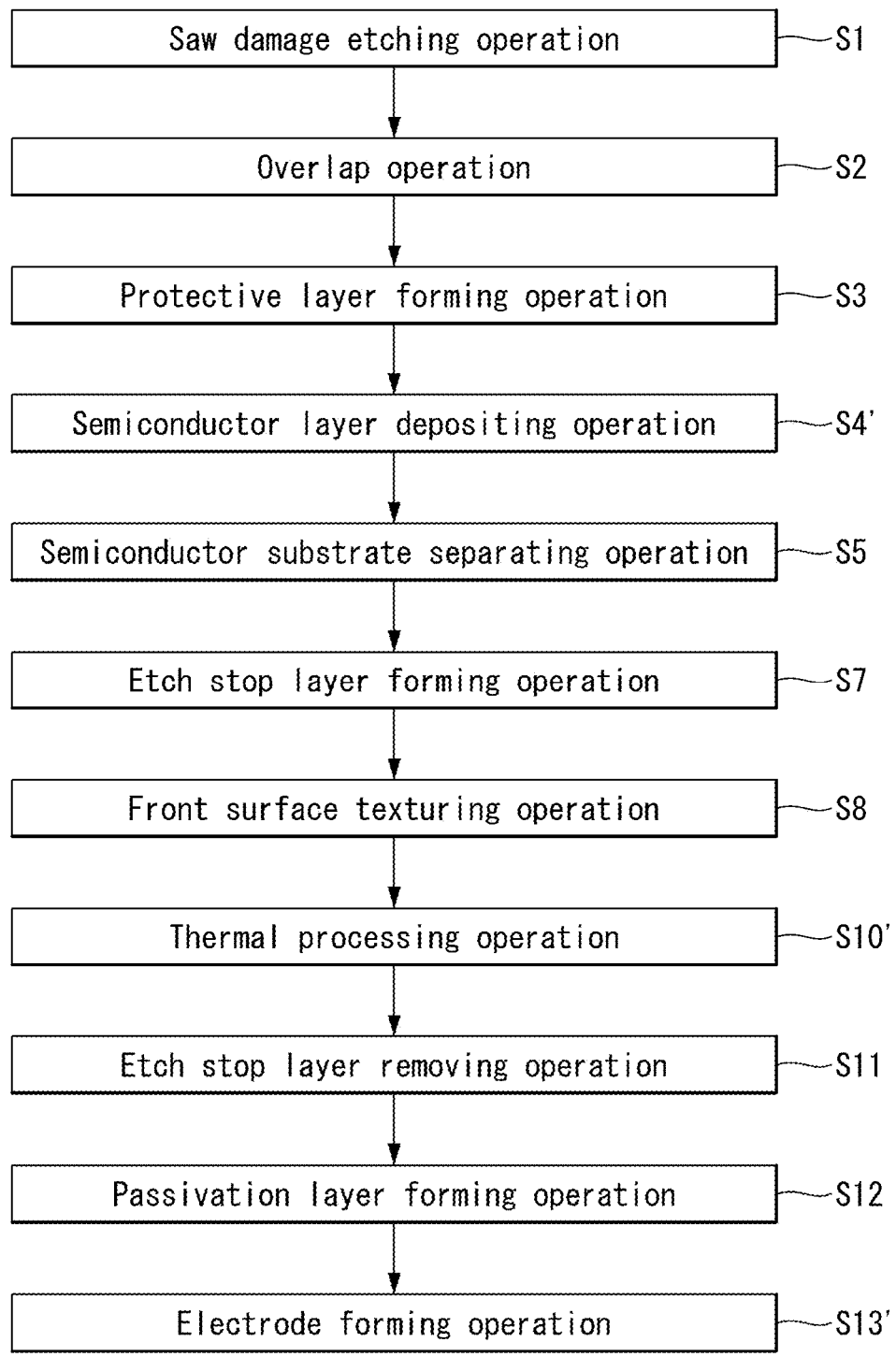
FIGS. 20 to 26 illustrate a method of manufacturing a solar cell according to another implementation of the invention.

FIG. 20 is a flow chart illustrating a method of manufacturing a solar cell according to another implementation of the invention. FIGS. 21 to 26 illustrate each of stages illustrated FIG. 20.

As shown in FIG. 20, a method of manufacturing a solar cell according to another implementation of the invention may at least include an overlap operation S2, a protective layer forming operation S3, a semiconductor layer depositing operation S4', a semiconductor substrate separating operation S5, and a front surface texturing operation S8. In addition, the method of manufacturing the solar cell according to another implementation of the invention may further include a saw damage etching operation S1, an etch stop layer forming operation S7, a thermal processing operation S10', an etch stop layer removing operation S11, a passivation layer forming operation S12, and an electrode forming operation S13'.

The saw damage etching operation S1, the etch stop layer forming operation S7, the thermal processing operation S10', the stop layer removing operation S11, and the passivation layer forming operation S12 may be omitted in the implementation of the invention, if desired or necessary. However, when the manufacturing method includes them, efficiency of the solar cell can be further improved. Thus, the implementation of the invention will be described using the method of manufacturing the solar cell including them as an example.

In the following description, a description identical or similar to that illustrated in FIGS. 4 to 17 is omitted in FIGS. 20 to 26, and a difference between them will be mainly described.

In the flow chart shown in FIG. 20, since the saw damage etching operation S1, the overlap operation S2, the protective layer forming operation S3, and the semiconductor substrate separating operation S5 are substantially the same as those illustrated in FIGS. 4 to 17, a further description may be briefly made or may be entirely omitted.

In the semiconductor layer depositing operation S4', a semiconductor layer 170 deposited by a low pressure chemical vapor deposition (LPCVD) equipment 500 may be formed of at least one of amorphous silicon having impurities or polycrystalline silicon having impurities.

Thus, in the semiconductor layer depositing operation S4', the semiconductor layer 170 on surfaces of two semiconductor substrates 110 overlapping each other may be formed of at least one of amorphous silicon doped with impurities or polycrystalline silicon doped with impurities.

Alternatively, unlike this, the semiconductor layer 170 formed in the semiconductor layer depositing operation S4' may be formed of amorphous silicon not doped with impurities or polycrystalline silicon not doped with impurities and then may be doped with impurities.

Figure 21:
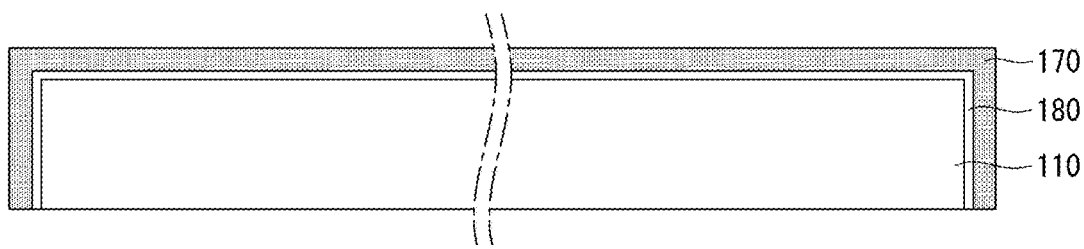

After the semiconductor layer depositing operation S4', the semiconductor substrate separating operation S5 may be performed. Hence, as shown in FIG. 21, the semiconductor layer 170 may be formed on a back surface and a side of the semiconductor substrate 110.

The semiconductor layer 170 having impurities as described above may contain impurities of a first conductivity type or impurities of a second conductivity type and may be formed as the second conductive region 170 shown in FIGS. 18 and 19.

Figure 22:
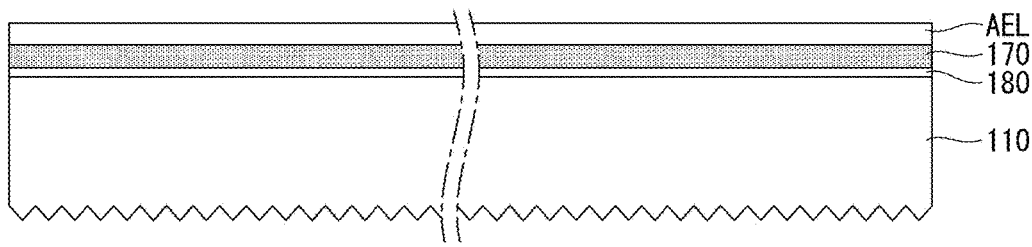

After the semiconductor layer depositing operation S4', the etch stop layer forming operation S7 and the front surface texturing operation S8 may be sequentially performed. Hence, as shown in FIG. 22, an etch stop layer AEL may be formed on the back surface of the semiconductor substrate 110, and uneven portions may be formed on a front surface of the semiconductor substrate 110.

Next, the thermal processing operation S10' of thermally processing the semiconductor substrate 110 in a furnace equipment 600 may be performed.

Figure 23:
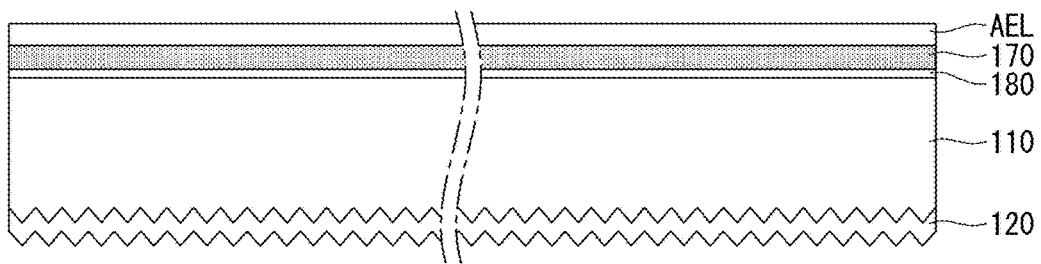
Figure 24:
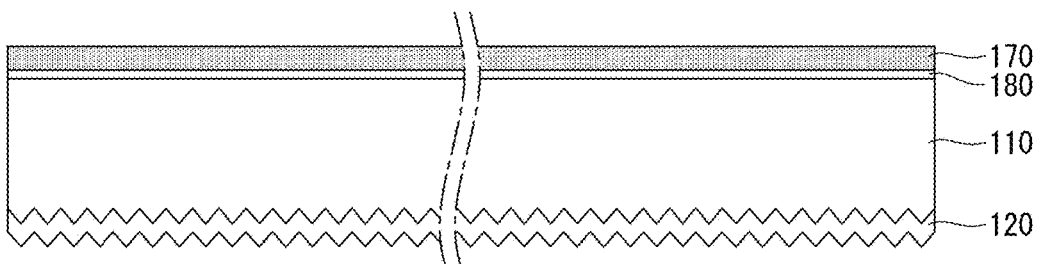
Figure 25:
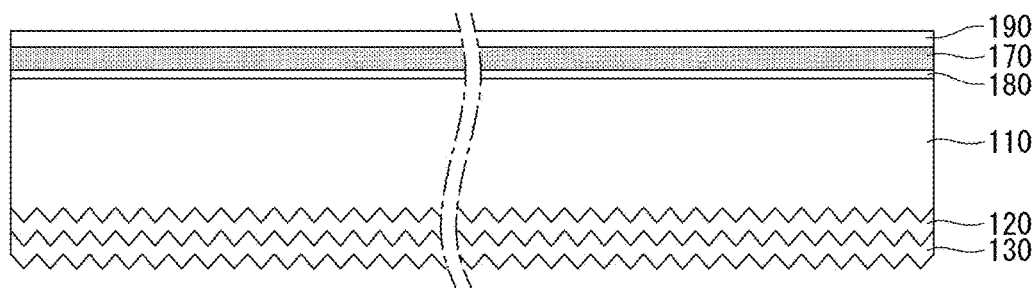
Figure 26:
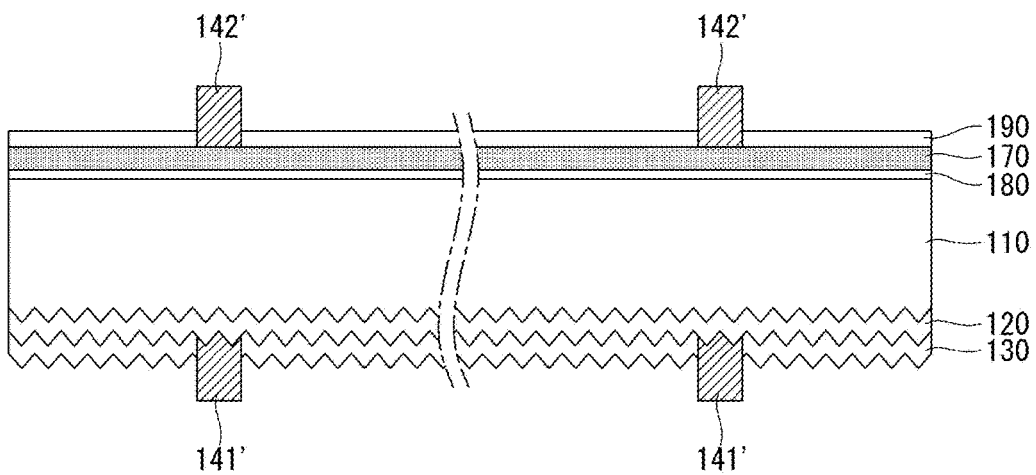

As shown in FIG. 23, in the thermal processing operation S10', when the semiconductor substrate 110 is thermally processed in the furnace equipment 600, a gas having impurities of a conductivity type opposite a conductivity type of impurities contained in the semiconductor layer 170 may be diffused into the front surface of the semiconductor substrate 110 in the furnace equipment 600 to form a first conductive region 120.

Further, in the thermal processing operation S10', the impurity gas may be diffused into the front surface of the semiconductor substrate 110, and at the same time impurities contained in the semiconductor layer 170 formed on the back surface of the semiconductor substrate 110 may be activated. Hence, a second conductive region 170 may be formed.

Next, in the etch stop layer removing operation S11, the etch stop layer AEL which has been formed on the back surface of the semiconductor substrate 110 may be removed.

Next, the passivation layer forming operation S12 may be performed. Hence, a back passivation layer 190 may be entirely formed on the back surface of the semiconductor substrate 110, and a front passivation layer 190 may be entirely formed on the front surface of the semiconductor substrate 110. The front passivation layer 190 may serve as the anti-reflection layer 130 illustrated in FIGS. 18 and 19.

Next, the electrode forming operation S13 of forming first electrodes 141' on the first conductive region 120 formed at the front surface of the semiconductor substrate 110 and forming second electrodes 142' on the second conductive region 170 formed at the back surface of the semiconductor substrate 110 may be performed.

Hence, the solar cell illustrated in FIGS. 18 and 19 can be manufactured.

An example of the above-described method of manufacturing the solar cell can greatly increase the productivity of the solar cells by depositing the protective layer 180 and the semiconductor layer 170 on the two semiconductor substrates 110 overlapping each other when forming the solar cell in which the protective layer 180 and the semiconductor layer 170 are deposited on the back surface of the semiconductor substrate 110.

Further, the implementation of the invention can satisfactorily maintain the efficiency of the solar cell by depositing the semiconductor layer 170 on the back surfaces of the two semiconductor substrates 110 and then texturing the front surface of each semiconductor substrate 110 to completely remove the semiconductor layer 170 formed at a portion of the edge of the front surface of the semiconductor substrate 110.

Although implementations have been described with reference to a number of illustrative implementations thereof, it should be understood that numerous other modifications and implementations can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a solar cell, the method comprising:
an overlapping operation of overlapping a first surface of a first semiconductor substrate made of a silicon wafer to a first surface of a second semiconductor substrate made of a silicon wafer to form an overlapped semiconductor substrate, wherein the first surface of the first semiconductor substrate and the first surface of the second semiconductor substrate contact each other;

a semiconductor layer depositing operation of depositing a first semiconductor layer on a second surface of the first semiconductor substrate and a second semiconductor layer on a second surface of the second semiconductor substrate, wherein the second surface of the first semiconductor substrate is positioned at an opposite side of the first surface of the first semiconductor substrate and the second surface of the second semiconductor substrate is positioned at an opposite side of the first surface of the second semiconductor substrate;

a separating operation of separating the overlapped semiconductor substrate into the first semiconductor substrate and the second semiconductor substrate; and a texturing operation of texturing the first surface of the first semiconductor substrate.

2. The method of claim 1, further comprising:

a protective layer forming operation that is performed after the overlapping operation and before the semiconductor layer depositing operation and that comprises forming a first protective layer on the second surface of the first semiconductor substrate and a second protective layer on the second surface of the second semiconductor substrate, wherein the semiconductor layer depositing operation includes depositing the first semiconductor layer on the first protective layer and the second semiconductor layer on the second protective layer.

3. The method of claim 2, wherein the overlapping operation includes:

overlapping the first semiconductor substrate to the second semiconductor substrate by placing the first semiconductor substrate and the second semiconductor substrate together at a section of a frame, and placing the overlapped semiconductor substrate at the section of the frame inside a deposition equipment for the semiconductor layer depositing operation.

4. The method of claim 2, wherein the semiconductor layer depositing operation is performed using a low pressure chemical vapor deposition (LPCVD) equipment.

5. The method of claim 1, wherein each of the first semiconductor layer and the second semiconductor layer includes at least one of intrinsic amorphous silicon, intrinsic polycrystalline silicon, amorphous silicon having impurities, or polycrystalline silicon having impurities.

6. The method of claim 5, wherein the first semiconductor layer includes a first conductive region having impurities of a first conductive type or a second conductive region having impurities of a second conductivity type that is opposite to the first conductivity type.

7. The method of claim 6, further comprising:

a first thermal processing operation that is performed between the separating operation and the texturing operation and that comprises thermally processing at least one portion of the first semiconductor layer that is formed on the second surface of the first semiconductor substrate to form the first conductive region;

a second thermal processing operation that is performed after the texturing operation and that comprises thermally processing, to form a second conductive region, (i) the first surface of the first semiconductor substrate and (ii) a portion of the first semiconductor layer that excludes the at least one portion of the first semiconductor layer formed on the second surface of the first semiconductor layer; and an electrode forming operation of forming a first electrode on the first conductive region and forming a second electrode on the second conductive region.

8. The method of claim 7, wherein the first thermal processing operation includes:

thermally processing the at least one portion of the first semiconductor layer to form the portion of the first semiconductor layer as the first conductive region.

9. The method of claim 5, wherein the first surface of the first semiconductor substrate includes a third conductive region having impurities of a first conductivity type, and wherein the first semiconductor layer that is deposited on the second surface of the first semiconductor substrate includes a fourth conductivity region comprising at least one of amorphous silicon or polycrystalline that have impurities of a second conductive type being opposite to the first conductive type.

10. The method of claim 9, further comprising:

a thermal processing operation that is performed after the texturing operation and that comprises thermally processing (i) at least one portion of the first surface of the first semiconductor substrate to form the third conductive region and (ii) at least one portion of the first semiconductor layer to form the fourth conductive region; and an electrode forming operation of forming a third electrode that is coupled to the third conductive region and a fourth electrode that is coupled to the fourth conductive region.

11. The method of claim 1, wherein a thickness of the first semiconductor layer and a thickness of the second semiconductor layer are from 250 nm to 450 nm.

12. The method of claim 1, wherein the semiconductor layer depositing operation further comprises:

depositing a third semiconductor layer on a third surface of the first semiconductor substrate.

13. The method of claim 12, wherein the texturing operation includes:

texturing the first surface of the first semiconductor substrate using a reactive ion etching (ME) method or a wet etching method, and removing the third semiconductor layer formed on the third surface of the first semiconductor substrate.

14. The method of claim 13, wherein an etching depth of the first surface of the first semiconductor substrate is from 100 nm to 5 µm.

15. The method of claim 1, wherein the separating operation includes individually separating the overlapped semiconductor substrate.

16. A method of manufacturing a solar cell, the method comprising:

an overlapping operation of overlapping a first surface of a first semiconductor substrate to a first surface of a second semiconductor substrate to form an overlapped semiconductor substrate;

a semiconductor layer depositing operation of depositing a first semiconductor layer on a second surface of the first semiconductor substrate and a second semiconductor layer on a second surface of the second semiconductor substrate;

a separating operation of separating the overlapped semiconductor substrate into the first semiconductor substrate and the second semiconductor substrate;

a texturing operation of texturing the first surface of the first semiconductor substrate;

a thermal processing operation of thermally processing the first semiconductor substrate to form a first conductive region having impurities of a first conductivity type and a second conductive region having impurities of a second conductivity type that is opposite to the first conductivity type; and an electrode forming operation of forming a first electrode that is coupled to the first conductive region and a second electrode that is coupled to the second conductive region.

17. The method of claim 16, wherein the first semiconductor layer includes at least one of intrinsic amorphous silicon, intrinsic polycrystalline silicon, amorphous silicon having impurities, or polycrystalline silicon having impurities.

18. The method of claim 16, wherein the semiconductor layer depositing operation further comprises:
depositing a third semiconductor layer on a third surface of the first semiconductor substrate.

19. The method of claim 16, wherein the texturing operation includes:
texturing the first surface of the first semiconductor substrate using an RIE method or a wet etching method, and
removing a third semiconductor layer formed on a third surface of the first semiconductor substrate.

20. The method of claim 16, wherein the separating operation includes individually separating the overlapped semiconductor substrate.

* * * * *